United States Patent
Deng et al.

(10) Patent No.: US 11,160,173 B2
(45) Date of Patent: Oct. 26, 2021

(54) FIXING APPARATUS

(71) Applicants: Tyco Electronics (Shanghai) Co. Ltd., Shanghai (CN); Measurement Specialities (Chengdu) Ltd., Chendu (CN); TE Connectivity Corporation, Berwyn, PA (US)

(72) Inventors: Yingcong Deng, Shanghai (CN); Lan Gong, Shanghai (CN); Qian Ying, Shanghai (CN); Dandan Zhang, Shanghai (CN); Lvhai Hu, Shanghai (CN); Yun Liu, Shanghai (CN); Lin Ye, Shanghai (CN); Yong Yan, Shanghai (CN); Roberto Francisco-Yi Lu, Shanghai (CN); Qinglong Zeng, Shanghai (CN)

(73) Assignees: Tyco Electronics (Shanghai) Co. Ltd., Shanghai (CN); Measurement Specialties (Chengdu) Ltd., Chengdu (CN); TE Connectivity Services GmbH, Schaffhausen (CH)

( * ) Notice: Subject to any disclaimer, the term of this patent is extended or adjusted under 35 U.S.C. 154(b) by 592 days.

(21) Appl. No.: 15/867,911

(22) Filed: Jan. 11, 2018

(65) Prior Publication Data
US 2018/0206344 A1 Jul. 19, 2018

(30) Foreign Application Priority Data
Jan. 13, 2017 (CN) .......................... 201710024577.X

(51) Int. Cl.
*H05K 3/32* (2006.01)
*H01R 12/51* (2011.01)
(Continued)

(52) U.S. Cl.
CPC .......... *H05K 3/325* (2013.01); *H01R 12/515* (2013.01); *H05K 1/117* (2013.01); *H05K 3/301* (2013.01); *H05K 3/3405* (2013.01); *H01R 43/0256* (2013.01); *H01R 43/0263* (2013.01); *H05K 1/111* (2013.01); *H05K 3/303* (2013.01); *H05K 3/3421* (2013.01); *H05K 2201/10227* (2013.01); *H05K 2201/10287* (2013.01); *H05K 2203/0165* (2013.01); *H05K 2203/0278* (2013.01); *H05K 2203/167* (2013.01)

(58) Field of Classification Search
CPC .......... H05K 13/0015; H05K 13/0069; H05K 2203/0165; H05K 2201/102; H05K 3/325; Y10T 29/53265; H01R 12/515
USPC .................................... 29/832, 760
See application file for complete search history.

(56) References Cited

U.S. PATENT DOCUMENTS 3,972,463 A * 8/1976 Conlon et al. .......... H05K 7/06
2013/0186941 A1 * 7/2013 Nikkhoo ............ H05K 13/0015
228/176

* cited by examiner

*Primary Examiner* — Livius R. Cazan
(74) *Attorney, Agent, or Firm* — Barley Snyder

(57) ABSTRACT

A fixing apparatus comprises a first fixing device and a second fixing device. The first fixing device is adapted to position and fix a circuit board having at least one pad. The first fixing device has a first positioning groove adapted to position the circuit board. The second fixing device is adapted to position and fix at least one wire. The second fixing device has at least one second positioning groove adapted to position the at least one wire. Each second positioning groove is aligned with a corresponding pad on the circuit board so that the wire in the second positioning groove is aligned with the corresponding pad on the circuit board.

20 Claims, 4 Drawing Sheets

(51) Int. Cl.
*H05K 1/11* (2006.01)
*H05K 3/30* (2006.01)
*H05K 3/34* (2006.01)
*H01R 43/02* (2006.01)

FIXING APPARATUS

CROSS-REFERENCE TO RELATED APPLICATION

This application claims the benefit of the filing date under 35 U.S.C. § 119(a)-(d) of Chinese Patent Application No. 201710024577.X, filed on Jan. 13, 2017.

FIELD OF THE INVENTION

The present invention relates to a fixing apparatus and, more particularly, to a fixing apparatus adapted to position and fix a circuit board and a wire.

BACKGROUND

In electronics manufacturing, an elongated wire is often soldered to a pad of a circuit board. In order to ensure soldering accuracy, the wire and the circuit board must be accurately positioned and fixed at a predetermined position in advance so that the wire is accurately aligned with the corresponding pad on the circuit board.

No known fixing device is capable of accurately positioning and fixing the circuit board and the wire. In the prior art, the circuit board and the wire are usually manually positioned and fixed, which reduces the soldering accuracy and correspondingly reduces the quality of a soldered product.

SUMMARY

A fixing apparatus comprises a first fixing device and a second fixing device. The first fixing device is adapted to position and fix a circuit board having at least one pad. The first fixing device has a first positioning groove adapted to position the circuit board. The second fixing device is adapted to position and fix at least one wire. The second fixing device has at least one second positioning groove adapted to position the at least one wire. Each second positioning groove is aligned with a corresponding pad on the circuit board so that the wire in the second positioning groove is aligned with the corresponding pad on the circuit board.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
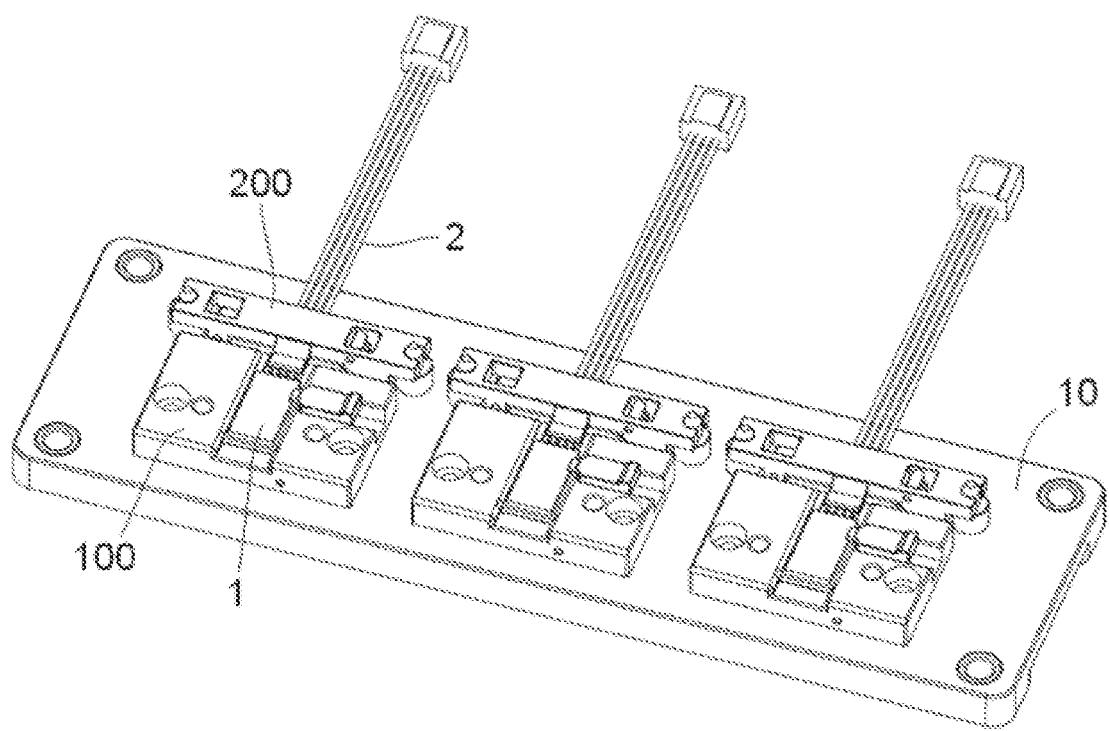
FIG. 1 is a perspective view of a fixing apparatus according to the invention.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

Figure 2:
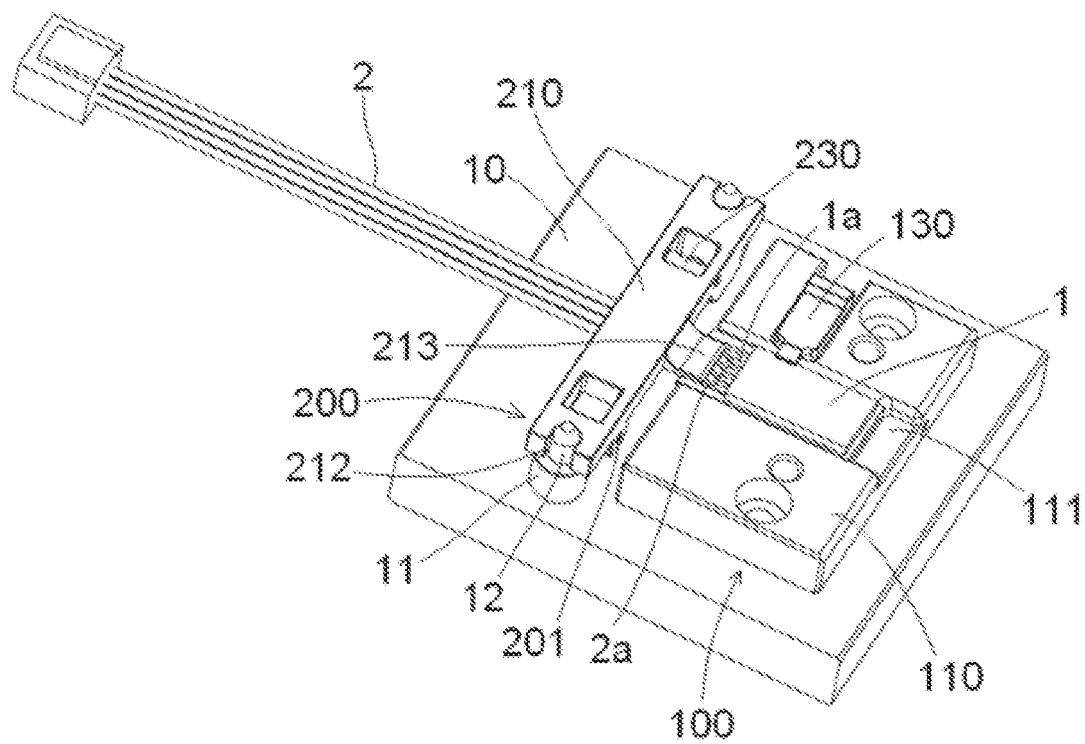
FIG. 2 is a perspective view of a first fixing device and a second fixing device of the fixing apparatus.

A fixing apparatus according to the invention is shown in FIGS. 1 and 2. The fixing apparatus includes a first fixing device 100 and a second fixing device 200. The first fixing device 100 is adapted to position and fix a circuit board 1. The second fixing device 200 is adapted to position and fix at least one wire 2.

Figure 3:
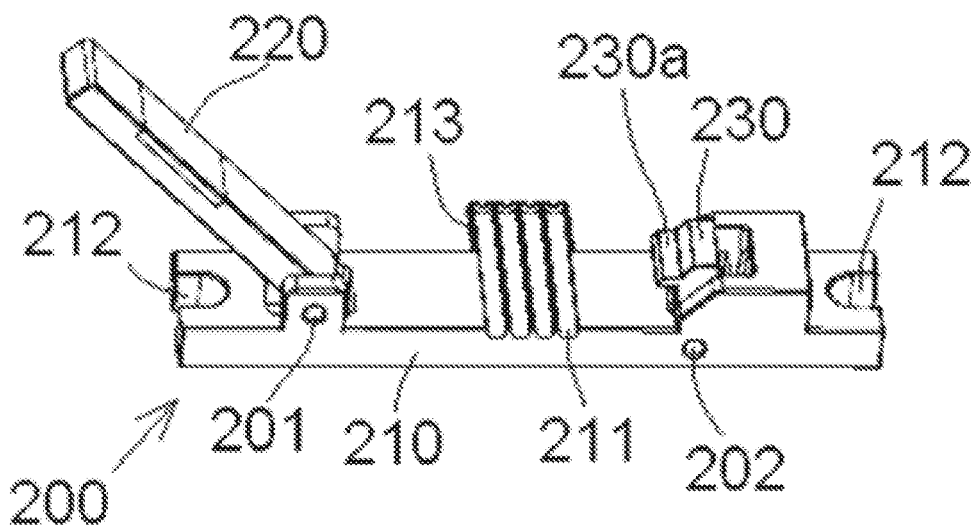
FIG. 3 is a perspective view of the second fixing device with a pressing cover of the second fixing device in an open state.
Figure 5:
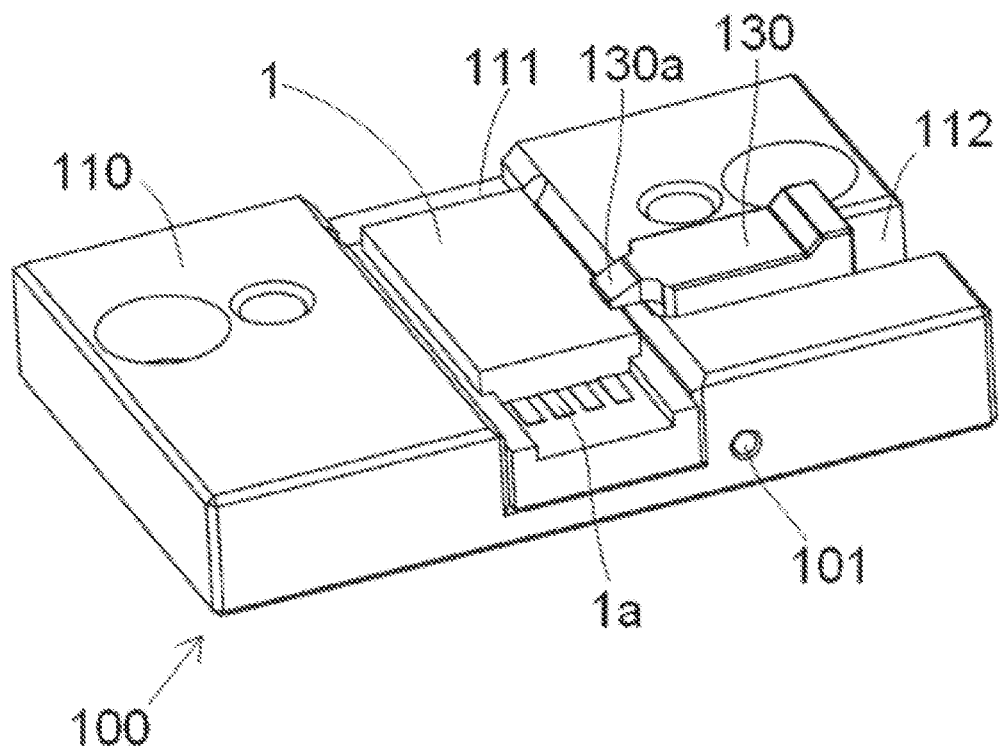
FIG. 5 is a perspective view of the first fixing device with a first lock of the first fixing device in a locking position.

As shown in FIGS. 2, 3, and 5, the first fixing device 100 has a first positioning groove 111 adapted to position the circuit board 1, which has at least one pad 1a, and the second fixing device 200 has at least one second positioning groove 211 adapted to position the at least one wire 2 to be electrically connected to the at least one pad 1a. Each second positioning groove 211 is aligned with a corresponding pad 1a on the circuit board 1 so that the wire 2 fixed in the second positioning groove 211 is aligned with the corresponding pad 1a on the circuit board 1.

Figure 6:
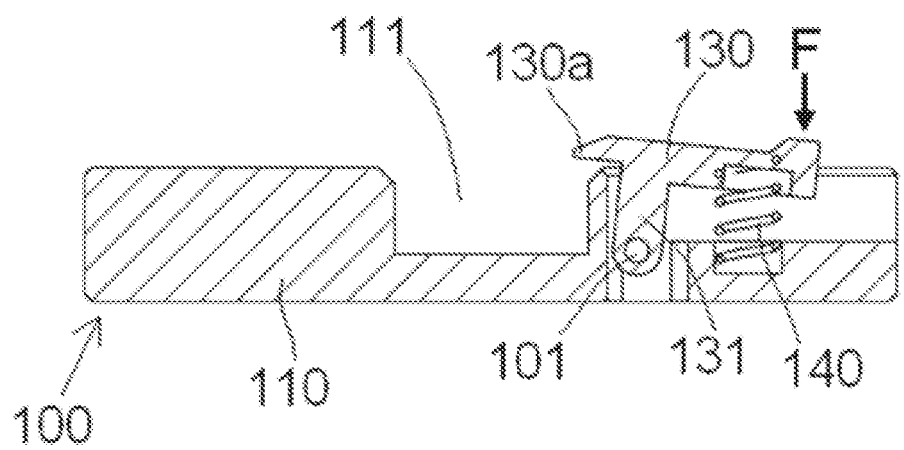
FIG. 6 is a sectional view of the first fixing device with the first lock in an unlocked position.

The first fixing device 100 is shown in FIGS. 5 and 6 and includes a first fixing base 110 and a first lock 130. The first positioning groove 111 is formed in the first fixing base 110 and extends in an axial direction of the wire 2. The first lock 130 is pivotally connected to a side of the first fixing base 110 and is adapted to be rotated between a locked position and the unlocked position.

The first lock 130 is adapted to hold and lock the circuit board 1 in the first positioning groove 111 when being in the locked position shown in FIG. 5. The first lock 130 is formed with a first locking lip 130a extending from a first end thereof toward the first positioning groove 111, as shown in FIG. 6. The first locking lip 130a is adapted to be locked onto an edge portion of the circuit board 1 and hold the circuit board 1 in the first positioning groove 111.

The first lock 130 has a connection portion 131 pivotally connected to the first fixing base 110 as shown in FIG. 6. The first fixing base 110 has a first spring 140 extending in a thickness direction of the second fixing base 210 and adapted to push the first lock 130 upwardly to bias the first lock 130 into the locked position. When the first lock 130 receives a downward pressing force F at a second end opposite the first end having the first locking lip 130a, against the first spring 140, the first lock 130 overcomes the biasing force of the first spring 140 to be rotated from the locked position to the unlocked position, so that the first lock 130 is disengaged from the circuit board 1. When the downward pressing force F is released, the first lock 130 is automatically rotated from the unlocked position to the locked position under the biasing force of the first spring 140.

The first fixing base 110, as shown in FIGS. 5 and 6, has a receiving slot 112 extending in a direction perpendicular to the axial direction of the wire 2. The first lock 130 and the first spring 140 are disposed in the receiving slot 112. The connection portion 131 of the first lock 130 is pivotally connected to a sidewall of the receiving slot 112 by a pivot shaft 101.

Figure 4:
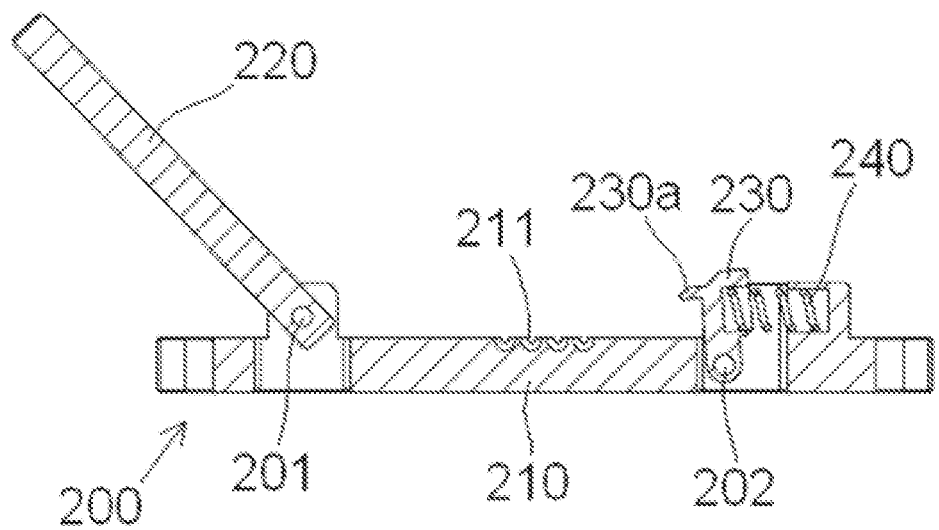
FIG. 4 is a sectional view of the second fixing device with the pressing cover in the open state.

The second fixing device 200, as shown in FIGS. 3 and 4, includes a second fixing base 210, a pressing cover 220, and a second lock 230. The second positioning groove 211 is formed in the second fixing base 210. The pressing cover 220 is pivotally connected to a first side of the second fixing base 210 by a first pivot shaft 201 and is adapted to be rotated between an open state and a closed state. The second lock 230 is pivotally connected to a second side of the second fixing base 210 opposite to the first side by a second pivot shaft 202 and is adapted to be rotated between a locked position and an unlocked position. The pressing cover 220 presses and holds the wire 2 in the second positioning groove 211 when in the closed state. The second lock 230 locks the pressing cover 220 in the closed state when the second lock 230 is in the locked position.

The second lock 230, as shown in FIGS. 3 and 4, has a second locking lip 230a extending from a first end of the second lock 230 toward the second positioning groove 211. The second locking lip 230a is adapted to be locked onto an edge portion of the pressing cover 220.

The second fixing base 210 has a second spring 240 extending in the direction perpendicular to the axial direction of the wire 2. The second spring 240 has an end pressed against a second end of the second lock 230 opposite the first end to hold the second lock 230 in the locked position. When the second lock 230 receives a driving force against a biasing force of the second spring 240, the second lock 230 may overcome the biasing force of the second spring 240 to be rotated from the locked position to the unlocked position so that the second lock 230 is disengaged from the pressing cover 220. When the driving force applied to the second lock 230 is released, the second lock 230 may be automatically rotated from the unlocked position to the locked position under the biasing force of the second spring 240.

The second fixing base 210, as shown in FIGS. 2 and 3, has a pressing tongue 213 extending horizontally toward the first fixing base 110 in the axial direction of the wire 2. The second positioning groove 211 is formed on surfaces of the pressing tongue 213 and the second fixing base 210. The pressing tongue 213, as shown in FIG. 2, is adapted to press an end portion 2a of the wire 2 fixed in the second positioning groove 211 against a corresponding pad 1a on the circuit board 1.

As shown in FIGS. 1 and 2, the fixing apparatus further comprises a mounting base 10 onto which the first fixing device 100 and the second fixing device 200 are mounted. The second fixing base 210 has a semicircular positioning recess 212 at both ends thereof, as shown in FIG. 3. The mounting base 10 has two support platforms 11, each of which has a circular positioning post 12. The second fixing base 210 is supported on the two support platforms 11 at both ends thereof, respectively, and the positioning posts 12 are fitted in the positioning recesses 212 of the second fixing base 210.

Before connecting the wires 2 to the circuit board 1, the second fixing device 200 is first disassembled from the mounting base 10; the wires 2 are clamped between the pressing cover 220 and the second fixing base 210; and the second fixing device 200 is then mounted onto the mounting base 10 by the positioning posts 12 and the positioning recesses 212. After the second fixing device 200 is mounted onto the mounting base 10, the pressing cover 220 is located below the second fixing base 210 and faces a surface of the mounting base 10. The pressing cover 220 is not in contact with the surface of the mounting base 10 when the second fixing device 200 is mounted onto the mounting base 10; the second fixing device 200 is suspended and supported on the mounting base 10 by the two support platforms 11.

In an embodiment shown in FIG. 1, the fixing apparatus may comprise a plurality of first fixing devices 100 arranged in a row to allow a plurality of circuit boards 1 to be simultaneously positioned and fixed. The fixing apparatus may comprise a plurality of second fixing devices 200 arranged in a row to allow a plurality of rows of wires 2 to be simultaneously positioned and fixed. In this way, it is possible to simultaneously solder the plurality of rows of wires 2 to the plurality of circuit boards 1 respectively, thereby improving the soldering efficiency.

What is claimed is:

1. A fixing apparatus, comprising:
    a first fixing device adapted to position and fix a circuit board having at least one pad, the first fixing device having:
    a first fixing base in which a first positioning groove adapted to position the circuit board is formed;
    a first lock pivotally connected to a side of the first fixing base and adapted to be rotated between a locked position and an unlocked position, the first lock adapted to hold and lock the circuit board in the first positioning groove in the locked position; and
    a first spring adapted to impart a first biasing spring force on the first lock, the first biasing spring force biasing the first lock into the locked position; and
    a second fixing device adapted to position and fix at least one wire, the second fixing device having at least one second positioning groove adapted to position the at least one wire, each second positioning groove is aligned with a corresponding pad on the circuit board so that the wire in the second positioning groove is aligned with the corresponding pad on the circuit board.

2. The fixing apparatus of claim 1, wherein the first lock has a first locking lip extending from a first end of the first lock adapted to engage an edge portion of the circuit board.

3. The fixing apparatus of claim 2, wherein the first lock has a connection portion pivotally connected to the first fixing base.

4. The fixing apparatus of claim 3, wherein the first spring is adapted to impart the first biasing spring force on a second end of the first lock opposite the first end.

5. The fixing apparatus of claim 4, wherein the first lock is adapted to be rotated from the locked position to the unlocked position by a downward pressing force applied on the second end of the first lock greater than the first spring biasing force, the first lock is separated from the circuit board in the unlocked position.

6. The fixing apparatus of claim 5, wherein the first fixing base has a receiving slot in which the first lock and the first spring are disposed and the connection portion of the first lock is pivotally connected to a sidewall of the receiving slot by a pivot shaft.

7. A fixing apparatus, comprising:
    a first fixing device adapted to position and fix a circuit board having at least one pad, the first fixing device having a first positioning groove adapted to position the circuit board; and
    a second fixing device adapted to position and fix at least one wire, the second fixing device having:
    a second fixing base in which at least one second positioning groove adapted to position the at least one wire is formed, each second positioning groove is aligned with a corresponding pad on the circuit board so that the wire in the second positioning groove is aligned with the corresponding pad on the circuit board;
    a pressing cover pivotally connected to a first side of the second fixing base and adapted to be rotated between an open state and a closed state, the pressing cover is adapted to press the wire in the second positioning groove in the closed state; and a second lock pivotally connected to a second side of the second fixing base opposite the first side and adapted to be rotated between a locked position and an unlocked position, the second lock is adapted to lock the pressing cover in the closed state in the locked position.

8. The fixing apparatus of claim 7, wherein the second lock has a second locking lip extending from a first end of the second lock toward the second positioning groove and adapted to engage an edge portion of the pressing cover.

9. The fixing apparatus of claim 8, wherein the second lock is pivotally connected to a second side of the second fixing base opposite the first side of the second fixing base.

10. The fixing apparatus of claim 9, wherein the second fixing base has a second spring, a first end of the second spring is pressed against a second end of the second lock opposite the first end of the second lock and imparts a second spring biasing force biasing the second lock into the locked position.

11. The fixing apparatus of claim 10, wherein the second lock is adapted to be rotated from the locked position to the unlocked position by a driving force applied on the second lock greater than the second spring biasing force, the second lock is disengaged from the pressing cover in the unlocked position.

12. The fixing apparatus of claim 11, wherein the pressing cover is pivotally connected to the first side of the second fixing base by a first pivot shaft and the second lock is pivotally connected to the second side of the second fixing base by a second pivot shaft.

13. The fixing apparatus of claim 7, wherein the second fixing base has a pressing tongue and the second positioning groove is formed on a surface of the pressing tongue and a surface of the second fixing base, the pressing tongue adapted to press an end portion of the wire in the second positioning groove against the corresponding pad on the circuit board.

14. The fixing apparatus of claim 13, further comprising a mounting base onto which the first fixing device and the second fixing device are mounted.

15. The fixing apparatus of claim 14, wherein the second fixing base has a semicircular positioning recess at a first end and an opposite second end of the second fixing base, the mounting base has a pair of support platforms each having a circular positioning post, and the second fixing base is supported on the pair of support platforms at the first end and the second end of the second fixing base, the positioning posts fitted in the positioning recesses.

16. The fixing apparatus of claim 15, wherein the pressing cover is disposed below the second fixing base and faces a surface of the mounting base when the second fixing device is mounted on the mounting base.

17. The fixing apparatus of claim 16, wherein the pressing cover is suspended and supported by the pair of support platforms and does not contact the surface of the mounting base when the second fixing device is mounted on the mounting base.

18. The fixing apparatus of claim 7, further comprising a plurality of first fixing devices arranged in a row and simultaneously positioning and fixing a plurality of circuit boards and a plurality of second fixing devices arranged in a row and simultaneously positioning and fixing a plurality of wires.

19. A fixing apparatus, comprising:
 a first fixing device adapted to fix a position of a circuit board and including a first lock, the first lock including a first free end movable between an unlocked position and a locked position under a first biasing spring force for selectively engaging with an edge of the circuit board for locking the circuit board in the fixed position; and
 a second fixing device adapted to fix a position of at least one wire with respect to the circuit board and including:
 a cover pivotally connected on a first end thereof to a fixing base of the second fixing device and having a second end movable between an open position and a closed position, the cover configured to fix the position of the at least one wire with respect to the circuit board in the closed position; and
 a second lock adapted to selectively engage with the second moveable end of the cover to hold and lock the cover in the closed position under a second biasing spring force.

20. The fixing apparatus of claim 19, wherein the second lock has a first end adapted to engage an edge portion of the pressing cover and a second end pivotally connected to the fixing base of the second fixing device.

* * * * *